(12) United States Patent
Delfino

(10) Patent No.: US 9,710,131 B2
(45) Date of Patent: Jul. 18, 2017

(54) COMPUTER-IMPLEMENTED METHOD FOR MANIPULATING THREE-DIMENSIONAL MODELED OBJECTS OF AN ASSEMBLY IN A THREE-DIMENSIONAL SCENE

(71) Applicant: Dassault Systemes, Velizy Villacoublay (FR)

(72) Inventor: Christophe Rene Francis Delfino, Saint Laurent du Var (FR)

(73) Assignee: Dassault Systemes, Velizy Villacoubolay (FR)

( * ) Notice: Subject to any disclaimer, the term of this patent is extended or adjusted under 35 U.S.C. 154(b) by 167 days.

(21) Appl. No.: 14/250,344

(22) Filed: Apr. 10, 2014

(65) Prior Publication Data

US 2014/0325413 A1   Oct. 30, 2014

(30) Foreign Application Priority Data

Apr. 30, 2013 (EP) .................................... 13165965

(51) Int. Cl.
*G06F 3/048* (2013.01)
*G06F 3/0481* (2013.01)
(Continued)

(52) U.S. Cl.
CPC ...... *G06F 3/04815* (2013.01); *G06F 3/04842* (2013.01); *G06F 3/04845* (2013.01); *G06F 17/50* (2013.01); *G06F 2203/04805* (2013.01)

(58) Field of Classification Search
CPC combination set(s) only.
See application file for complete search history.

(56) References Cited

U.S. PATENT DOCUMENTS 5,490,241 A * 2/1996 Mallgren ............ G06F 3/04842
                                                    345/419
5,583,977 A * 12/1996 Seidl .................... G06F 3/04845
                                                    345/619
(Continued)

FOREIGN PATENT DOCUMENTS

WO    WO 2012/144984 A1    10/2012

OTHER PUBLICATIONS

Bidarra, Rafael et al., "Advanced Direct Manipulation of Feature Models", Retrieved from the Internet: URL:http://web.archive.org/web/20081002131842/http://graphics.tudelft.nl.rafa/myPapers/bidarra.Grapp07.pdf [retrieved on Jun. 13, 2013].

(Continued)

*Primary Examiner* — Hien Duong
(74) *Attorney, Agent, or Firm* — Hamilton, Brook, Smith & Reynolds, P.C.

(57) ABSTRACT

A computer-implemented method for manipulating three-dimensional modeled objects of an assembly in a three-dimensional scene comprising the steps of:
  displaying a three-dimensional bounding box (BB) encompassing at least one three-dimensional object, a face of the surface of the bounding box (BB) comprising a plurality of interactive surfaces which are parts of the face;
  hovering pointing means (PM) on the bounding box (BB); and
if at least one face of the surface of the bounding box (BB) is displayed such that its interactive surfaces are not accessible for the pointing means (PM), displaying a wider surface (WS) that allows accessibility of said interactive surfaces.

18 Claims, 4 Drawing Sheets

(51) Int. Cl.
*G06F 3/0484* (2013.01)
*G06F 17/50* (2006.01)

(56) References Cited

U.S. PATENT DOCUMENTS

| | | | | |
|---|---|---|---|---|
| 6,590,593 | B1* | 7/2003 | Robertson | G06F 3/0481 715/782 |
| 7,246,329 | B1* | 7/2007 | Miura | G06F 3/0481 715/764 |
| 7,312,796 | B1* | 12/2007 | Kikinis | G06T 19/00 345/419 |
| 7,480,873 | B2* | 1/2009 | Kawahara | G06F 3/04815 715/782 |
| 7,880,737 | B2* | 2/2011 | Elchuri | G06T 11/203 345/419 |
| 8,334,867 | B1* | 12/2012 | Davidson | G06F 3/04815 345/419 |
| 8,443,300 | B2* | 5/2013 | Nankani | G06F 3/04815 715/836 |
| 8,497,859 | B1* | 7/2013 | Hickman | G06T 19/00 345/419 |
| 2002/0046220 | A1* | 4/2002 | Freeman | G06F 17/30011 715/273 |
| 2002/0091739 | A1* | 7/2002 | Ferlitsch | G06F 17/24 715/273 |
| 2008/0068373 | A1* | 3/2008 | Sendhoff | G06T 19/20 345/419 |
| 2008/0094398 | A1* | 4/2008 | Ng | G06F 3/0486 345/427 |
| 2008/0237981 | A1* | 10/2008 | Gilles | A63F 9/0842 273/153 S |
| 2008/0307360 | A1* | 12/2008 | Chaudhri | G06F 3/0481 715/835 |
| 2008/0307364 | A1* | 12/2008 | Chaudhri | G06F 3/0483 715/836 |
| 2009/0055729 | A1* | 2/2009 | Audet | G06F 17/30716 715/243 |
| 2009/0125801 | A1* | 5/2009 | Algreatly | G06F 3/0481 715/234 |
| 2010/0169836 | A1* | 7/2010 | Stallings | G06F 3/04817 715/848 |
| 2011/0307834 | A1* | 12/2011 | Wu | A63F 13/06 715/836 |
| 2011/0310100 | A1* | 12/2011 | Adimatyam | G06F 3/017 345/420 |
| 2012/0131453 | A1* | 5/2012 | Pechanec | G06F 3/044 715/702 |
| 2012/0302303 | A1* | 11/2012 | Rosendo | A63F 9/0842 463/9 |
| 2013/0047100 | A1 | 2/2013 | Kroeger et al. | |
| 2013/0097563 | A1* | 4/2013 | Pacheco Rodrigues Velho | G06F 3/04815 715/850 |
| 2013/0271497 | A1* | 10/2013 | Choe | G06F 3/0346 345/659 |
| 2013/0321461 | A1* | 12/2013 | Filip | G06F 3/011 345/632 |
| 2014/0125557 | A1* | 5/2014 | Issayeva | G02B 27/017 345/8 |

OTHER PUBLICATIONS

European Search Report completed Jun. 18, 2013 for European Application No. 13165965.8 filed Apr. 30, 2013.

* cited by examiner

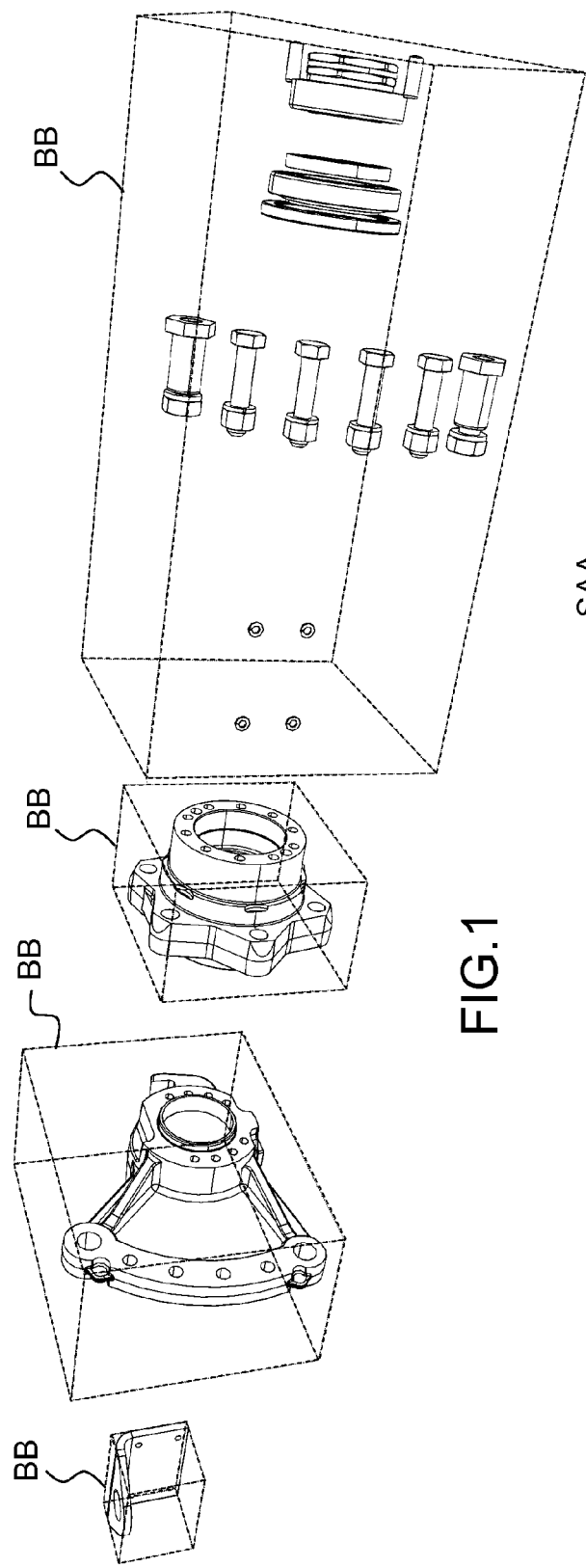
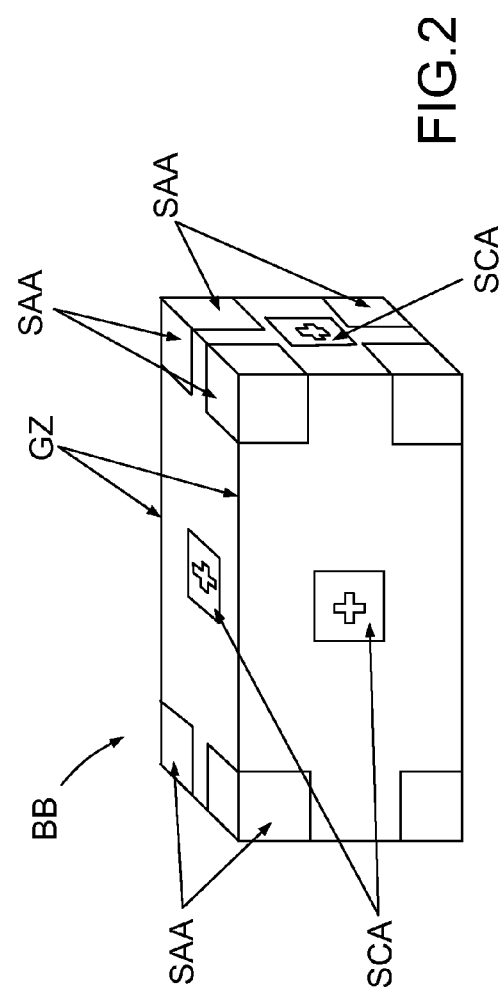
FIG.1
FIG.2

COMPUTER-IMPLEMENTED METHOD FOR MANIPULATING THREE-DIMENSIONAL MODELED OBJECTS OF AN ASSEMBLY IN A THREE-DIMENSIONAL SCENE

RELATED APPLICATION(S)

This application claims priority under 35 U.S.C. §119 or 365 to European Application No. EP13165965.8, filed Apr. 30, 2013. The entire teachings of the above application(s) are incorporated herein by reference.

BACKGROUND OF THE INVENTION

The invention relates to the field of computers programs and systems, and more specifically to the field of computer-implemented method for designing and/or authoring technical illustrations, or, in other words for manipulating three-dimensional modeled objects of an assembly in a three-dimensional scene.

A number of systems and programs are offered on the market for designing and/or authoring technical illustrations, such as the one provided by Dassault Systèmes under the trademark 3DVIA® Composer.

These systems, mainly dedicated to non-CAD software users, allow a user to produce, for instance, technical illustrations, maintenance or training operations, assembly instructions, marketing presentations, or interactive applications (like interactive parts catalogues . . . ).

In these systems, there exist some advanced tools to create exploded view of a 3D product, but none of them provide solutions for manipulating easily groups of parts or objects of an assembly in a three-dimensional scene.

Indeed, for making an exploded view of a set of an assembly of objects, for example for assembly instructions, during a rearrangement of objects, the mode exploded is exited, and it results in a loss of information and many manipulations to reselect objects and modifying the arrangement. An exploded view represents an assembly of objects spread out according to their relationship, in particular objects positioned to show how they fit together when assembled.

Thus, it is difficult and complex to easily reorganize objects of the exploded view, notably to reorganize a group of objects simultaneously and in a linked manner with other objects of the assembly.

SUMMARY OF THE INVENTION

A goal of the invention is to provide a computer-implemented method and a system to overcome the above mentioned problems.

It is proposed, according to one aspect of the invention, a computer-implemented method for manipulating three-dimensional modeled objects of an assembly in a three-dimensional scene comprising the steps of:

displaying a three-dimensional bounding box encompassing at least one three-dimensional object, a face of the surface of the bounding box comprising a plurality of interactive areas which are parts of the face;

hovering pointing means on the bounding box; and if at least one face of the surface of the bounding box is displayed such that its interactive areas are not accessible for the pointing means, displaying a wider surface that allows accessibility of said interactive areas.

Such a method allows to easily and quickly modify an exploded view, with very few manipulations. More precisely, such a method facilitates the use of an interactive bounding box giving access to all the interactive commands even if the surface size of a face of the bounding box do not allow it by default.

Such an interactive area can be two-dimensional or three-dimensional, and can partly covers the face. In a three-dimensional example, interactive areas can have a non-zero thickness, and for instance be cambered. In a preferred embodiment of the invention, an interactive area is a two-dimensional or plane element comprised in a face.

According to an embodiment, said interactive areas are not accessible for the pointing means and a wider surface that allows accessibility of said interactive areas is displayed, if at least one dimension of the face not accessible by the pointing means is smaller than a threshold.

Thus, once the user puts his mouse over a surface too small to display the interactive commands of the interactive box, the surface should be automatically extended and display the commands.

According to an embodiment, said wider surface is displayed along said dimension of the face not accessible by the pointing means.

Thus, the wider surface is only extended along the too low dimension, and so a dimensional consistency is kept compared to any other surfaces that are already displayed.

According to an embodiment, said wider surface is displayed in the plane comprising said face not accessible by the pointing means.

Thus, keeping the surface in the same plane can also keep a visual consistency and not lose the user in handling.

According to an embodiment, said wider surface is centered on the face not accessible for the pointing means.

Centering the surface allows, for example when displaying progressive extension of the surface to understand visually what is the extended surface. In addition, the fact that this area is centered allows to keep symmetric controls.

According to an embodiment, said wider surface is displayed in partial-transparency or in semi-transparency.

The use of partial-transparency or in semi-transparency allows the user to see the objects in the bounding boxes while manipulating them.

According to an embodiment, the displaying of the wider surface is triggered by the hovering of the face of the surface of the bounding box whose interactive areas are not accessible for the pointing means.

Thus, when the user need to use the interactive areas of the face of the surface of the bounding box whose interactive areas are not accessible for the pointing means, the wider surface is automatically displayed.

According to an embodiment, the displaying of the wider surface is stopped when pointing means stop hovering said wider surface.

This is more practical for the user.

It is proposed, according to another aspect of the invention, a computer-readable medium having computer-executable instructions to cause the computer system to perform the method for manipulating three-dimensional modeled objects of an assembly in a three-dimensional scene as described above.

It is proposed, according to another aspect of the invention, computer program product, stored on a computer readable medium, for manipulating three-dimensional modeled objects of an assembly in a three-dimensional scene, comprising code means for causing the system to take the steps of the method as described above.

It is proposed, according to another aspect of the invention, an apparatus for manipulating three-dimensional modeled objects of an assembly in a three-dimensional scene comprising means for implementing the steps of the method as described above.

BRIEF DESCRIPTION OF THE DRAWINGS

The foregoing will be apparent from the following more particular description of example embodiments of the invention, as illustrated in the accompanying drawings in which like reference characters refer to the same parts throughout the different views. The drawings are not necessarily to scale, emphasis instead being placed upon illustrating embodiments of the present invention.

The invention will be better understood with the study of some embodiments described by way of non-limiting examples and illustrated by the accompanying drawings wherein:

FIG. 1 illustrates three-dimensional bounding boxes encompassing at least one three-dimensional object, according to an aspect of the invention;

FIG. 2 illustrates an interactive bounding box, according to an aspect of the invention;

DETAILED DESCRIPTION OF THE INVENTION

Figure 3:
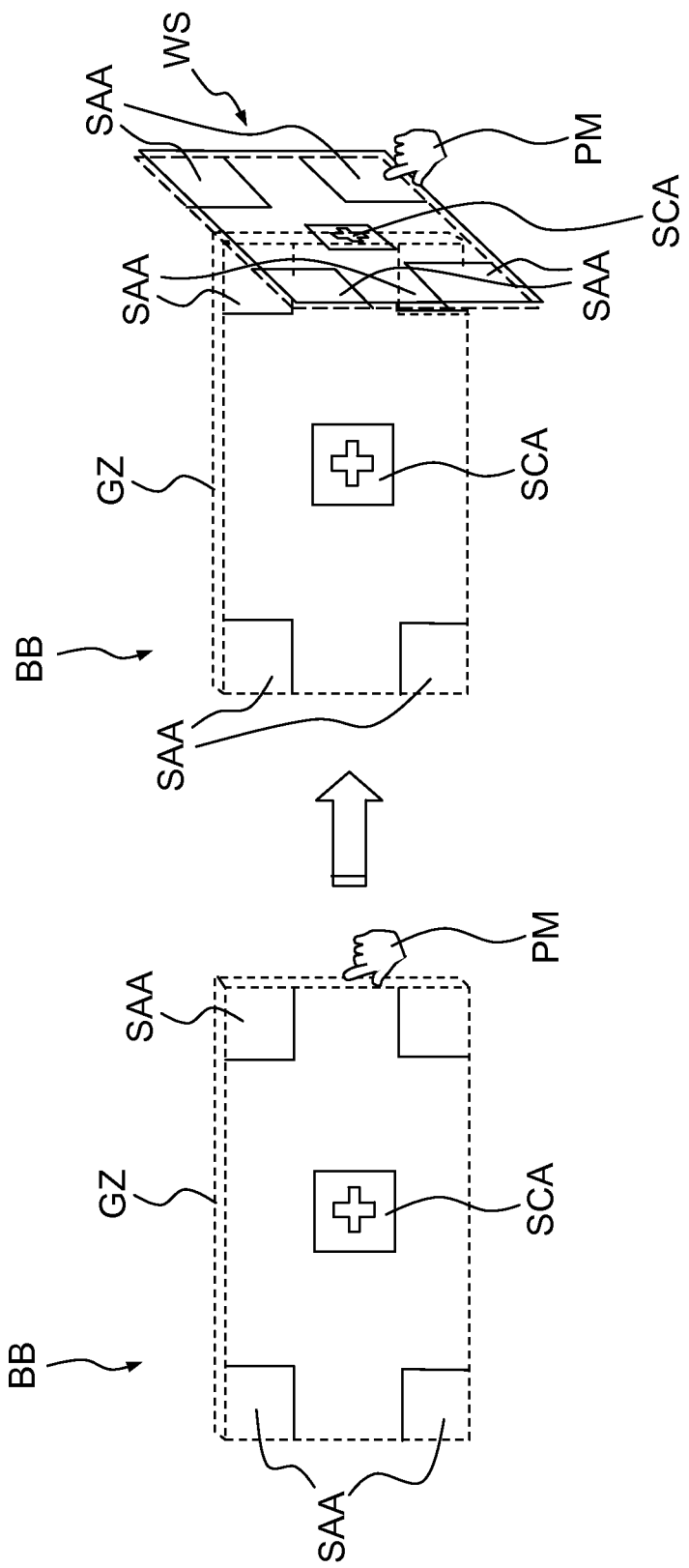
FIGS. 3a and 3b illustrate an example of a method according to an aspect of the invention.

A description of example embodiments of the invention follows.

The teachings of all patents, published applications and references cited herein are incorporated by reference in their entirety.

Following figures explain more in details the functioning of the present invention.

On FIG. 1 is illustrated an example of defining sets of objects of an assembly according to an aspect of the invention.

The user begins to determine sets of objects respectively associated to interactive bounding boxes BB. The present example comprises four bounding boxes.

In other words, the user can achieve this kind of visual result by initiating its exploded view.

On FIG. 2 is illustrated an example of a bounding box BB, wherein different controls are available with the interactive bounding box. A control is a command which allows a user to interact with the bounding box BB and trigger a predetermined functionality.

A bounding box BB comprises at least one selectable content area SCA of the surface of the bounding box BB. For example, for a parallelepiped bounding box BB, the faces of the bounding box BB can comprise an area, in the present example, a part which is a control to add objects of the assembly to the bounding box BB, for example in the center of the faces. On this example, the area is a surface.

A bounding box BB can further comprise at least one selectable axial area SAA of its surface to change the position of another bounding box BB along an axis orthogonal to said axial area SAA. For example, for a parallelepiped bounding box BB, the faces of the bounding box BB can comprise a part which is a control, for example in each corner of the faces, to change the position of another bounding box BB along an axis orthogonal to said axial part.

A bounding box BB can further comprise grab zones GZ, or, in other words grab areas, for example located around the edges of the bounding box BB.

The controls SCA, SAA of the bounding box BB can be displayed in a partial transparency, for example in a semi-transparency.

In other words, the user needs to use the interactive commands of the bounding boxes to re-position the sets or groups of objects of the assembly.

On FIGS. 3a and 3b is illustrated an example of a method according to an aspect of the invention.

On FIG. 3a is represented a pointing means PM, in the present case represented by a hand on the screen, representing the computer mouse, displaced by the user on a face of the bounding box BB whose interactive areas, on this example interactive surfaces SAA, SCA are not accessible by the pointing means PM.

The pointing means PM can be a computer mouse, a touchpen, or a sensitive touchscreen.

Then, the displaying of a wider surface WS is automatic, which remains displayed as long as the pointing means PM hovers said wider surface WS. The wider surface, with the interactive areas SAA, SCA, is displayed on this example on semi-transparency, as an example of partial-transparency.

A face of the bounding box BB can be considered as comprising a plurality of interactive surfaces not accessible for the pointing means PM, if at least one dimension of the face is smaller than a threshold, typically of twenty pixels. In an example, the threshold can be typically equivalent to three times the size of an interactive area along the corresponding dimension.

For example, the wider surface WS is displayed in the plane comprising said face not accessible by the pointing means PM, is centered on the face not accessible for the pointing means PM, and along said dimension of the face not accessible by the pointing means PM. Of course, these features can be used each alone or in combination.

Figure 4:
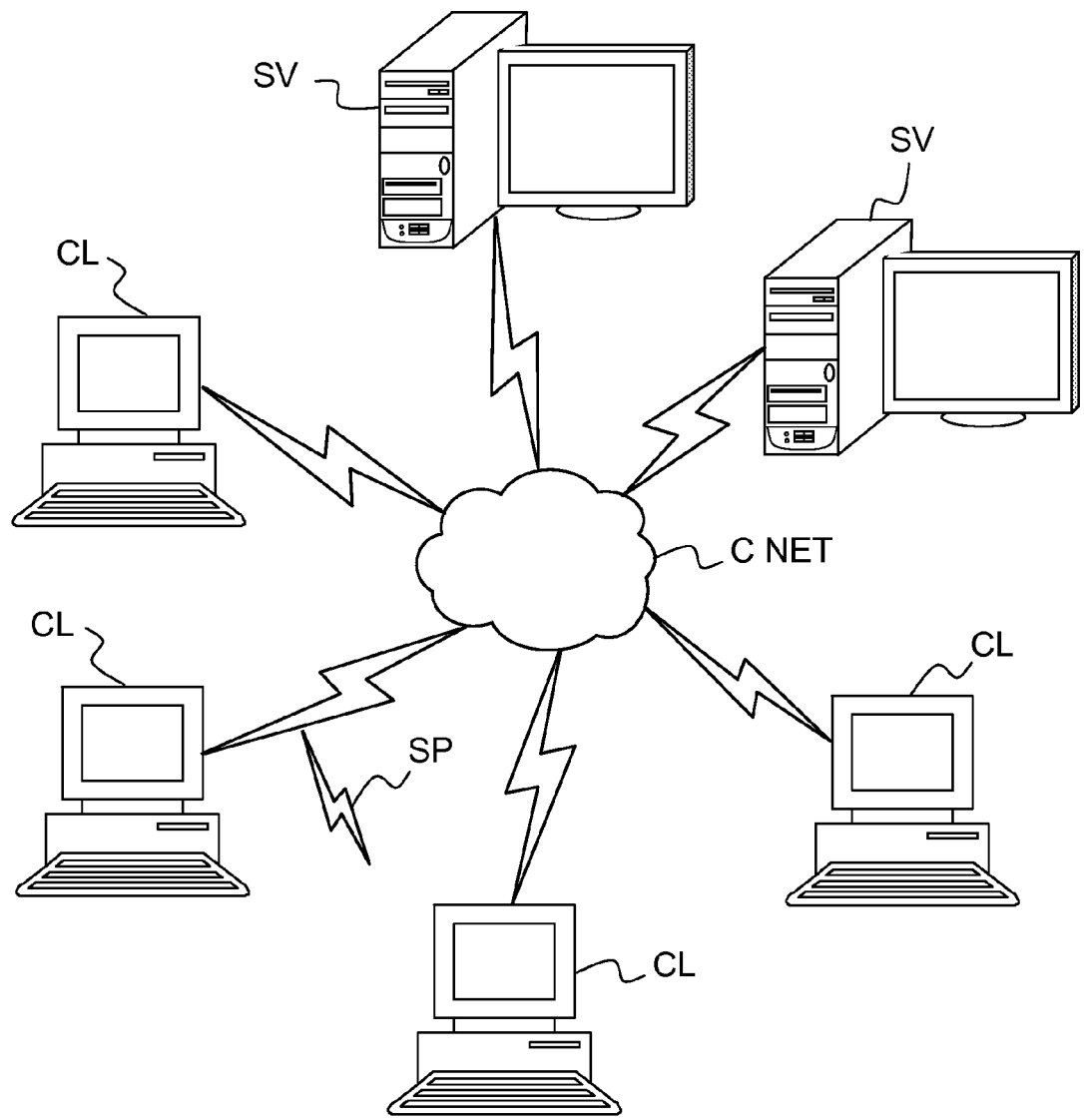
FIG. 4 illustrates a computer network or similar digital processing environment in which the present invention may be implemented.

FIG. 4 illustrates a computer network or similar digital processing environment in which the present invention may be implemented.

Client computer(s)/devices CL and server computer(s) SV provide processing, storage, and input/output devices executing application programs and the like. Client computer(s)/devices CL can also be linked through communications network CNET to other computing devices, including other client devices/processes CL and server computer(s) SV. Communications network 70 can be part of a remote access network, a global network (e.g., the Internet), a worldwide collection of computers, Local area or Wide area networks, and gateways that currently use respective protocols (TCP/IP, Bluetooth, etc.) to communicate with one another. Other electronic device/computer network architectures are suitable.

Figure 5:
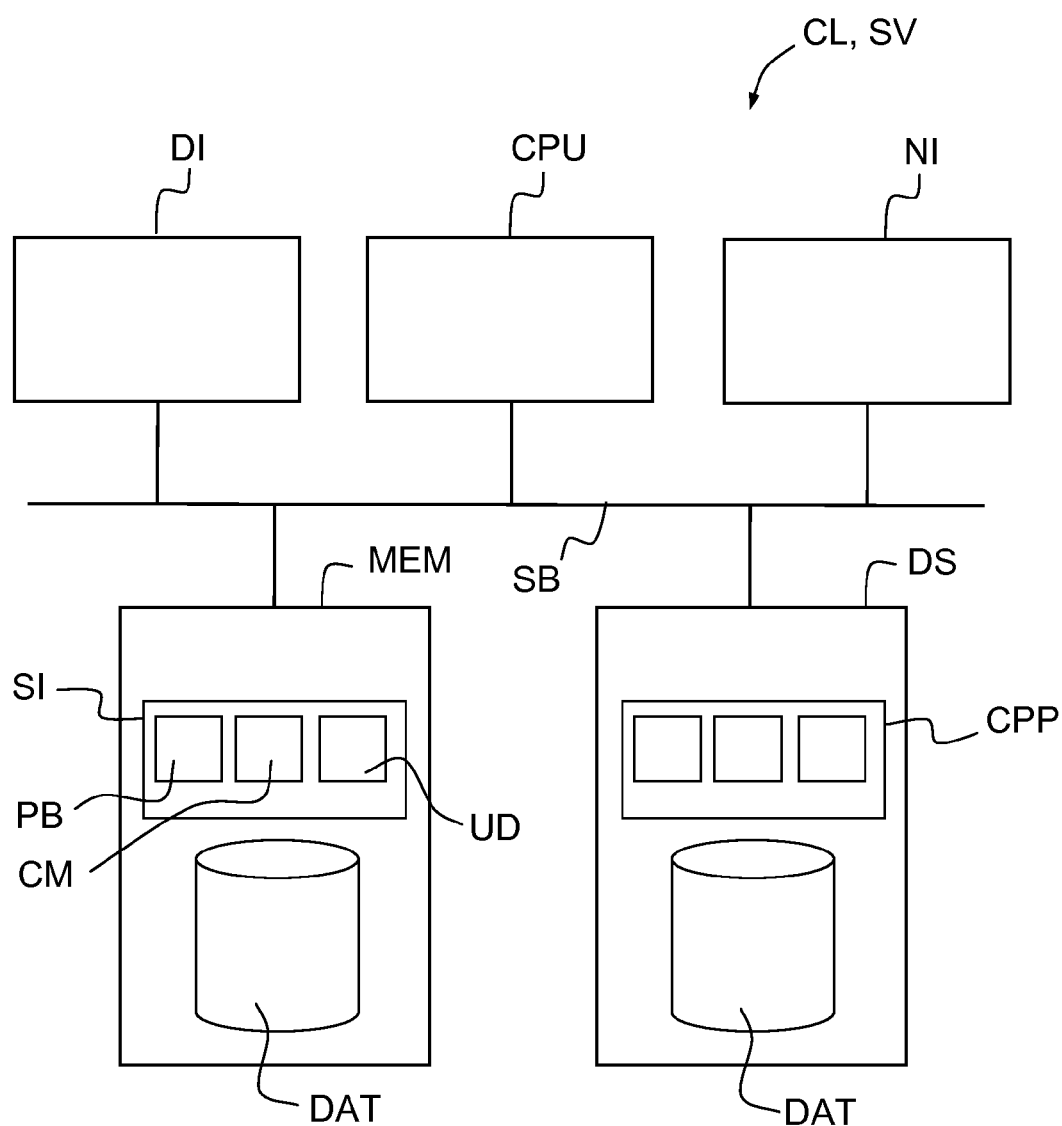
FIG. 5 illustrates a diagram of the internal structure of a computer.

FIG. 5 is a diagram of the internal structure of a computer (e.g., client processor/device CL or server computers SV) in the computer system of FIG. 4. Each computer CL, SV contains system bus SB, where a bus is a set of hardware lines used for data transfer among the components of a computer or processing system. Bus SB is essentially a shared conduit that connects different elements of a computer system (e.g., processor, disk storage, memory, input/output ports, network ports, etc. . . . ) that enables the transfer of information between the elements.

Attached to system bus SB is I/O device interface DI for connecting various input and output devices (e.g., keyboard, mouse, displays, printers, speakers, etc.) to the computer CL, SV. Network interface NI allows the computer to connect to various other devices attached to a network (e.g., network CNET of FIG. 4).

Memory MEM provides volatile storage for computer software instructions SI and data CPP used to implement an embodiment of the present invention (e.g., a first path builder PB, means CM for computing a second path, an updater UD implementing the method discussed in FIGS. 1 to 3, and supporting code detailed above).

Disk storage DS provides non-volatile storage for computer software instructions SI and data DAT used to implement an embodiment of the present invention. Central processor unit CPU is also attached to system bus SB and provides for the execution of computer instructions.

In one embodiment, the processor routines SI and data DAT are a computer program product (generally referenced CPP), including a computer readable medium (e.g., a removable storage medium such as one or more DVD-ROM's, CD-ROM's, diskettes, tapes, etc. . . . ) that provides at least a portion of the software instructions for the invention system. Computer program product CPP can be installed by any suitable software installation procedure, as is well known in the art.

In another embodiment, at least a portion of the software instructions may also be downloaded over a cable, communication and/or wireless connection. In other embodiments, the invention programs are a computer program propagated signal product SP embodied on a propagated signal on a propagation medium (e.g., a radio wave, an infrared wave, a laser wave, a sound wave, or an electrical wave propagated over a global network such as the Internet, or other network(s)). Such carrier medium or signals provide at least a portion of the software instructions for the present invention routines/program CPP.

In alternate embodiments, the propagated signal is an analog carrier wave or digital signal carried on the propagated medium. For example, the propagated signal may be a digitized signal propagated over a global network (e.g., the Internet), a telecommunications network, or other network.

In one embodiment, the propagated signal is a signal that is transmitted over the propagation medium over a period of time, such as the instructions for a software application sent in packets over a network over a period of milliseconds, seconds, minutes, or longer.

In another embodiment, the computer readable medium of computer program product CPP is a propagation medium that the computer system CL may receive and read, such as by receiving the propagation medium and identifying a propagated signal embodied in the propagation medium, as described above for computer program propagated signal product.

Generally speaking, the term "carrier medium" or transient carrier encompasses the foregoing transient signals, propagated signals, propagated medium, storage medium and the like.

While this invention has been particularly shown and described with references to example embodiments thereof, it will be understood by those skilled in the art that various changes in form and details may be made therein without departing from the scope of the invention encompassed by the appended claims.

What is claimed is:

1. A computer-implemented method for manipulating three-dimensional modeled objects of an assembly in a three-dimensional scene comprising the steps of:

displaying a three-dimensional bounding box (BB) encompassing at least one three-dimensional object, a face of the surface of the bounding box (BB) comprising a plurality of interactive areas which are parts of the face;

hovering pointing means (PM) on the bounding box (BB); and if at least one face of the surface of the bounding box (BB) is displayed such that its interactive areas are not accessible by the pointing means (PM), displaying the at least one face as a wider surface (WS) that allows accessibility of said interactive areas, said wider surface (WS) being wider than the at least one face of the surface of the bounding box with interactive areas not accessible by the pointing means (PM);

wherein said displaying the at least one face as a wider surface (WS) is performed such that original orientation of the bounding box (BB) is maintained.

2. Computer-implemented method according to claim 1, wherein said interactive areas are not accessible by the pointing means (PM) and the wider surface (WS) that allows accessibility of said interactive areas is displayed, if at least one dimension of the at least one face with interactive areas not accessible by the pointing means (PM) is smaller than a threshold.

3. Computer-implemented method according to claim 2, wherein said wider surface (WS) is displayed along said dimension of the at least one face with interactive areas not accessible by the pointing means (PM).

4. Computer-implemented method according to claim 1, wherein said wider surface (WS) is displayed in the plane comprising said at least one face of the surface of the bounding box (BB).

5. Computer-implemented method according to claim 1, wherein said wider surface (WS) is centered on the at least one face with interactive areas not accessible by the pointing means (PM).

6. Computer-implemented method according to claim 1, wherein said wider surface (WS) is displayed in partial-transparency or in semi-transparency.

7. Computer-implemented method according to claim 1, wherein the displaying of the wider surface (WS) is triggered by hovering the pointing means (PM) on the at least one face of the surface of the bounding box (BB) with interactive areas are not accessible by the pointing means (PM).

8. Computer-implemented method according to claim 1, wherein the displaying of the wider surface (WS) is stopped when the pointing means (PM) stops hovering on said wider surface (WS).

9. A non-transitory computer-readable medium comprising:

non-transitory computer storage; and computer-executable instructions held in the computer storage and configured to cause a computer system to perform manipulating of three-dimensional modeled objects of an assembly in a three-dimensional scene, including:

displaying a three-dimensional bounding box (BB) encompassing at least one three-dimensional object, a face of the surface of the bounding box (BB) comprising a plurality of interactive areas which are parts of the face;

hovering pointing means (PM) on the bounding box (BB); and if at least one face of the surface of the bounding box (BB) is displayed such that its interactive areas are not accessible by the pointing means (PM), displaying the at least one face as a wider surface (WS) that allows accessibility of said interactive areas, said wider surface (WS) being wider than the at least one face of the surface of the bounding box with interactive areas not accessible by the pointing means (PM);

wherein said displaying the at least one face as a wider surface (WS) is performed such that original orientation of the bounding box (BB) is maintained.

10. A computer program product, comprising:

a non-transitory computer readable medium; and code means embodied on the computer readable medium, for manipulating three-dimensional modeled objects of an assembly in a three-dimensional scene, the code means causing a computer system to:

display a three-dimensional bounding box (BB) encompassing at least one three-dimensional object, a face of the surface of the bounding box (BB) comprising a plurality of interactive areas which are parts of the face;

hover pointing means (PM) on the bounding box (BB); and if at least one face of the surface of the bounding box (BB) is displayed such that its interactive areas are not accessible by the pointing means (PM), display the at least one face as a wider surface (WS) that allows accessibility of said interactive areas, said wider surface (WS) being wider than the at least one face of the surface of the bounding box with interactive areas not accessible by the pointing means (PM);

wherein the code means causes the computer system to display the at least one face as a wider surface (WS) such that original orientation of the bounding box (BB) is maintained.

11. Computer apparatus for manipulating three-dimensional modeled objects of an assembly in a three-dimensional scene comprising:

means for displaying a three-dimensional bounding box (BB) encompassing at least one three-dimensional object, a face of the surface of the bounding box (BB) comprising a plurality of interactive areas which are parts of the face;

means for hovering pointing means (PM) on the bounding box (BB); and display means, wherein if at least one face of the surface of the bounding box (BB) is displayed such that its interactive areas are not accessible by the pointing means (PM), the display means displaying the at least one face as a wider surface (WS) that allows accessibility of said interactive areas, said wider surface (WS) being wider than the at least one face of the surface of the bounding box with interactive areas not accessible by the pointing means (PM);

wherein said displaying the at least one face as a wider surface (WS) is performed such that original orientation of the bounding box (BB) is maintained.

12. Computer apparatus as claimed in claim 11, wherein said interactive areas are not accessible by the pointing means (PM) and the wider surface (WS) that allows accessibility of said interactive areas is displayed, if at least one dimension of the at least one face with interactive areas not accessible by the pointing means (PM) is smaller than a threshold.

13. Computer apparatus as claimed in claim 12, wherein said wider surface (WS) is displayed along said dimension of the at least one face with interactive areas not accessible by the pointing means (PM).

14. Computer apparatus as claimed in claim 11, wherein said wider surface (WS) is displayed in the plane comprising said at least one face of the surface of the bounding box (BB).

15. Computer apparatus as claimed in claim 11, wherein said wider surface (WS) is centered on the at least one face with interactive areas not accessible by the pointing means (PM).

16. Computer apparatus as claimed in claim 11, wherein said wider surface (WS) is displayed in partial-transparency or in semi-transparency.

17. Computer apparatus as claimed in claim 11, wherein the display means displaying of the wider surface (WS) is triggered by hovering the pointing means (PM) on the at least one face of the surface of the bounding box (BB) with interactive areas are not accessible by the pointing means (PM).

18. Computer apparatus as claimed in claim 11, wherein the display means displaying of the wider surface (WS) is stopped when the pointing means (PM) stops hovering on said wider surface (WS).

* * * * *